July 13, 1965 A. J. GIGER 3,195,018

TRANSISTOR AMPLIFIER

Filed Sept. 27, 1961

INVENTOR
A. J. GIGER
BY [signature]
ATTORNEY

United States Patent Office 3,195,018

Patented July 17, 1965

3,195,018

TRANSISTOR AMPLIFIER

Adolf J. Giger, Murray Hill, N.J., assignor to Bell Telephone Laboratories, Incorporated, New York, N.Y., a corporation of New York

Filed Sept. 27, 1961, Ser. No. 141,196
10 Claims. (Cl. 317—148.5)

This invention relates to amplifiers and more particularly to a direct-current amplifier which will amplify symmetrical voltages only and reject any single-sided components which may reach the input terminals.

Many devices, such as strain gauges or detection circuits, require the amplification of the relatively low symmetrical output voltage which does not necessarily use ground as a reference. Thus, the amplifying mechanism must be sensitive to the floating symmetrical output information voltage of these aforementioned devices only and be relatively insensitive to any voltages with respect to ground which may be "riding" on the information signals, otherwise the amplified information will be useless.

The object of the present invention is the improvement of D.C. amplifiers to permit amplification of floating signals only with rejection of any signals with respect to ground which may reach the input terminals of the amplifying device.

Accordingly, one illustrative embodiment of the amplifier of the present invention comprises two complementary transistors (PNP and NPN transistors), having their emitters connected together through an impedance. The collector of one transistor is connected to a biasing supply voltage through another impedance while the collector of the second transistor is connected to ground through a third impedance. The output is taken between the collector of the second transistor and ground. The symmetrical ungrounded signal voltage is applied between the bases of the two transistors.

An analysis of this circuit configuration, as set forth hereinbelow, reveals the fact that the output signal will be dependent on the ungrounded symmetrical input voltage only and will not be affected by any voltage with respect to ground which may be applied in common to the bases of the transistors.

In an example of a device utilizing the amplifier of the present invention an alarm circuit is described which comprises an error detecting device. The output of the device is applied between the bases of the transistors and a relay connected in parallel with the transistors and joining the collectors. When a fault occurs, a voltage will appear on the bases of the transistors thereby driving them into conduction. This releases the relay which, in turn, activates a circuit to indicate a fault has occurred in the monitored circuit.

Figure 1:
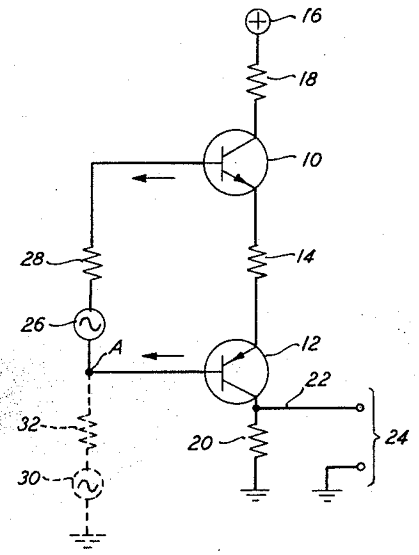
Figure 2:
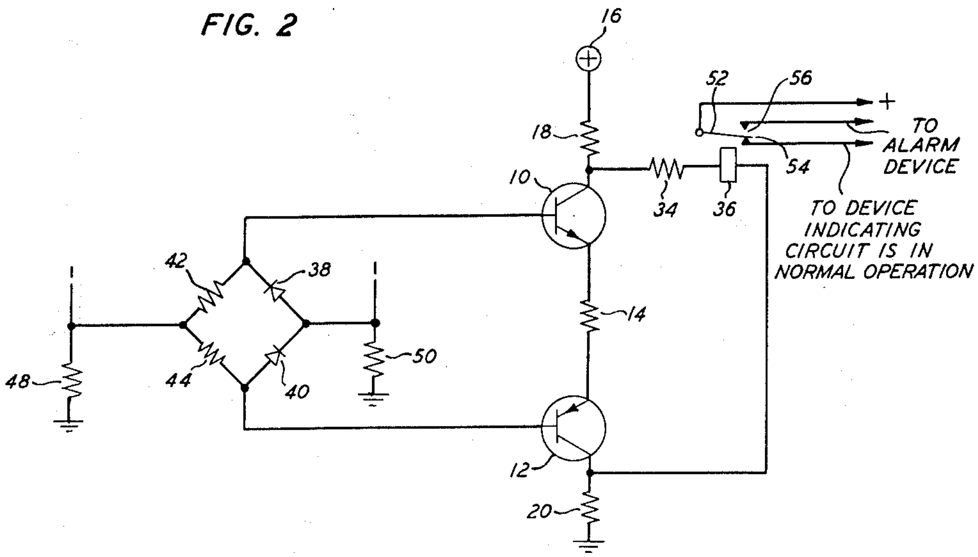

The above and other features of the present invention will become more apparent from the following description taken in conjunction with the drawings in which:

FIG. 1 is a schematic representation of the amplifier of the present invention; and FIG. 2 is a schematic representation of an alarm circuit in which the amplifier in accordance with the invention may be employed.

As shown in FIG. 1, an NPN transistor 10 is connected in series with a PNP transistor 12 through an impedance 14. The collector of transistor 10 is connected to the supply source 16 through the collector resistor 18. The collector of transistor 12 is connected to ground through resistor 20. Lead 22 is connected between the collector of transistor 12 and one of the output terminals 24, the other output terminal is grounded. The bases of transistors 10 and 12 are connected to a floating or ungrounded symmetrical voltage represented schematically as source 26 and having an internal resistance shown schematically as resistor 28. A second source 30, shown dotted in FIG. 1, and having an internal resistance shown schematically as resistor 32 is connected between the bases of the transistors and ground. This dotted portion represents the undesired single-sided or grounded signal which is applied to the bases of the amplifier. The information to be amplified to the exclusion of the undesired signal is that provided by source 26.

In analyzing the circuit of FIG. 1 it is assumed that the base-emitter voltages of both transistors are negligible, therefore the current through resistor 14 will be determined by the voltage applied to the bases. Accordingly:

$$V_{14}=V_{26}+i_{b10}R_{28} \quad (1)$$

$$i_{b10}=(\alpha_{10}i_e-i_e)=(\alpha_{10}-1)i_e \quad (2)$$

$$i_{b12}=(i_e-\alpha_{12}i_e)=(1-\alpha_{12})i_e \quad (3)$$

$$\therefore V_{14}=V_{26}+(\alpha_{10}-1)i_eR_{28} \quad (4)$$

$$V_A=V_{30}+(i_{b10}+i_{b12})R_{32} \quad (5)$$

$$=V_{30}+(\alpha_{10}-\alpha_{12})i_eR_{32}$$

$$V_{20}=\alpha_{12}i_eR_{20} \quad (6)$$

$$K=\frac{V_{20}}{V_{26}}=\frac{\alpha_{12}i_eR_{20}}{V_{14}-(\alpha_{10}-1)i_eR_{28}} \quad (7)$$

$$K=\frac{\alpha_{12}R_{20}}{R_{14}-(\alpha_{10}-1)R_{28}}$$

$$K=\frac{\alpha_{12}R_{20}}{R_{14}+(1-\alpha_{10}(R_{28}}$$

$$\therefore K=\alpha_{12}\frac{R_{20}}{R_{14}}\frac{1}{1+\frac{R_{28}}{R_{14}}(1-\alpha_{10})} \quad (8)$$

where:

$V_{14}$ is the voltage drop across the resistor 14
$V_{26}$ is the output voltage of source 26
$i_e$ is the emitter current
$i_{b10}$ is the base current of transistor 10
$i_{b12}$ is the base current of transistor 12
$\alpha_{10}$, $\alpha_{12}$ are the common base short circuit current gains of transistors 10 and 12, respectively
$V_A$ is the voltage at point A
$V_{30}$ is the output voltage of source 30
$V_{20}$ is the voltage across the output resistor 20
$K$ is the gain of the amplifier.

Thus, it is quantitatively shown that the output signal is dependent upon the voltage of source 26 only and is not affected by source 30. The physical reason for this new and unobvious result is as follows (again assuming the base-emitter voltage drops of the transistors are negligible): If the potential of source 30 changes, the change will be applied to the bases of the transistors in common. This change will be reflected by a change at the emitters of the transistors. Since these variations will be equal and in the same direction, the net change will be zero. However, it is to be noted that the gain is dependent upon the $\alpha$'s of the two transistors (equation 8) which, of course, are dependent upon the collector-base biases of the two transistors. This bias will change due to variations of an undesired voltage with respect to ground (source 30). But proper biasing methods, which are well known in the art, can reduce this variation of $\alpha$ to a negligible amount (i.e., by operating the transistor on its linear portion) thereby assuring that the output of the amplifier will not be effected in any degree by the undesired signal contributed by source 30.

The amplifier of the present invention may be used, by way of example, in an alarm circuit such as that shown in FIG. 2. (Like numerals indicate like elements in FIGS. 1 and 2.) The collectors of transistors 10 and 12 are connected through the series circuit comprising resistor 34 and the winding of relay 36. The output arms of an error detecting bridge comprising diodes 38 and 40 connected in parallel with resistors 42 and 44, are connected between the bases of the transistors. One input of the bridge circuit consists of the voltage drop across resistor 48 and the other input of the bridge circuit consists of the voltage drop across resistor 50. These resistors may be a part of the circuit to be monitored. In the embodiment described both voltages must be equal and positive to assure that transistors 10 and 12 are properly biased. The average value of these two input voltages (which correspond to voltage source 30 of FIG. 1) may vary without affecting the output of the transistor amplifier as noted hereinabove. The arm 52 of relay 36 is in contact with contact 54 when the circuit is in normal operating condition. Contact 54 may be connected to a lamp or some such device which will signify that the circuit is in operating condition. Contact 56 is connected to a device which will signify an alarm such as a bell, a flashing lamp, etc. when a fault occurs.

Initially the voltage drops across resistors 48 and 50 are chosen to be equal. This will, in effect, produce a zero voltage between the bases and prevent transistors 10 and 12 from conducting. Thus, the current path will be from source 16, through resistors 18 and 34, through the winding of relay 36, and through resistor 20 to ground. If a fault occurs in the circuit which is being monitored the voltages across resistors 48 and 50 will become unequal. This will produce a unidirectional voltage difference between the bases of the transistors because of the rectifier bridge circuit. The transistors will now conduct and begin to draw current thereby increasing the voltage drop across resistor 18. This, in turn, will lower the voltage across resistor 34 and the winding of relay 36 until the point is reached at which the current through the winding of relay 36 will be insufficient to maintain the relay in the closed position. Thereupon the relay will be de-energized and arm 52 will now make contact with contact 56 to thereby signify a fault has occurred.

It is of special importance to note that the amplifier of the present invention is insensitive to the average voltage level of the two input voltages which appear across resistors 48 and 50 of FIG. 2. Very often, in circuits with which resistors 48 and 50 are associated to provide for monitoring, the average of the voltages across these two resistors may change without affecting the operation of the monitored circuit. If an amplifier is not insensitive to these variations of voltage an alarm would then be given needlessly. However, as noted hereinabove, the amplifier of the present invention is sensitive only to input voltage differences which indicate a trouble-condition in the circuit under consideration. On the other hand, if a conventional grounded amplifier is used, its output will depend on the single-sided signal (at the output of the bridge circuit). Likewise, if a push-pull amplifier is utilized, the collector current will vary as the single-sided signal varies and therefore the operating point of the push-pull amplifier will constantly change. Thus, it is seen that the amplifier of the present invention is of particular utility in the above disclosed circumstances.

What is claimed is:

1. An amplifier for signals from a source of symmetrically varying signal energy having undesired single-sided components comprising first and second transistors having input, output, and control electrodes, a first impedance interconnecting said input electrodes, a source of direct current potential with respect to ground connected to the output electrode of said first transistor, a second impedance connecting the output electrode of said second transistor to ground, means connecting the control electrodes of said transistors to receive signals from said source, said source comprising two impedances connected in series, two asymmetrical conducting means connected in series and two voltage sources, means connecting said two series impedances in parallel with said two series asymmetrical conducting means, means connecting the control electrode of one transistor to one of the junctions of an impedance and an asymmetrical conducting means, means connecting the control electrode of the other transistor to the other junction of an impedance and an asymmetrical conducting means, one of said sources being connected to the junction of said two impedances, the other of said sources being connected to the junction of said two asymmetrical conducting means.

2. An alarm circuit for amplifying symmetrical voltages caused by a fault condition in an electronic circuit comprising first and second transistors having input, output and control electrodes, and a relay, a first impedance interconnecting said input electrodes, a source of direct current potential with respect to ground connected to the output electrode of said first transistor, a second impedance connecting the output electrode of said second transistor to ground, a source of symmetrically varying signal energy and means connecting the control electrode of said transistors to receive signals from said source of symmetrically varying signal energy, means connecting said relay between said output electrodes, said source of symmetrically varying signal energy comprising the parallel combination of two impedances in series and two asymmetrical conducting means in series, means connecting the junction of said two impedances to the electronic circuit, and means connecting the junction of said two asymmetrical conducting means to the electronic circuit so that the potential at this junction is equal in value to the potential existing at the junction of said two impedances when the electronic circuit is in normal operating condition, said source of symmetrically varying signal energy biasing said transistors into cut-off when the electronic circuit is in normal operating condition, said source biasing said transistors into conduction when a fault condition occurs in said electronic circuit to change the potentials existing at said junctions, said relay being de-energized to indicate a fault condition when said transistors are biased into conduction.

3. A signal amplifier comprising, in combination; a pair of variable impedance devices each having a first electrode, a second electrode and a control electrode and each having an impedance between said first electrode and second electrode that is dependent upon the current flowing in said control electrode; means connecting said first electrode of one of said pair and said first electrode of the other of said pair together; signal means connected between said control electrode of one of said pair and said control electrode of the other of said pair to supply a current to said control electrodes for simultaneously varying in like sense said impedance of one of said pair and said impedance of the other of said pair of said variable impedance devices; biasing means connected between the second electrode of one of said pair and the second electrode of the other of said pair of said variable impedance devices for supplying a current to said impedances; and means responsive to changes in said impedances for deriving an output from said amplifier.

4. A signal amplifier as defined in claim 3 wherein said variable impedance devices comprise transistors.

5. A signal amplifier as defined in claim 3 wherein said variable impedance devices comprise complementary transistors.

6. A signal amplifier as defined in claim 5 including a relay having a relay winding connected between the second electrodes of said variable impedance devices in parallel with said biasing means, said relay winding being energized when said transistors are biased in cutoff, the relay winding being de-energized when said transistors conduct in response to increases in the magnitude of current from said signal means.

7. In combination, a source of varying signals and a signal amplifier for said signals, said amplifier comprising a pair of transistors each having a principal current path and a control path, said transistors being connected together with said principal current path of one of said pair and said principal current path of the other of said pair in series and with said control path of one of said pair and said control path of the other of said pair forming a closed loop that includes said signal source, said control paths having their forward current directions the same around said closed loop, and means responsive to changes in said principal current paths for deriving an output from said amplifier.

8. In combination, a pair of transistors each having an emitter-collector path and a base-emitter control path, the impedance of said emitter-collector path in each transistor being inversely related to the magnitude of current flowing in said base-emitter path, first circuit means for connecting a source of an input signal in series relation with both said base-emitter path of one of said pair and said base-emitter path of the other of said pair to form a closed circuit loop such that variations of said input signal causes the current flowing through said loop to vary, a source of an operating potential, and second circuit means for connecting said emitter-collector path of one of said pair and said emitter-collector path of the other of said pair in series across said source of an operating potential, said last-named means including output means for delivering a signal related to the magnitude of current flowing through said emitter-collector paths.

9. In combination, a source of varying signal floating with respect to ground and a signal amplifier for said signal, said amplifier comprising a pair of complementary transistors each having a first electrode and second electrode and a control electrode the potential of which with respect to one of said first and second electrodes controls the impedance between said first and second electrodes, means for connecting said first electrode of one of said pair and said first electrode of the other of said pair together, means for applying signals from said source as a potential between said control electrode of one of said pair and said control electrode of the other of said pair to vary the potential of said control electrodes with respect to each other and independently of ground in direct response to said varying signal, the impedance between said first and second electrodes of each of said complementary transistors responding simultaneously and in the same direction to said signal between said control electrodes, and means responsive to current change through one of said first and second electrodes for deriving an output from said amplifier.

10. A signal amplifier comprising in combination, a pair of complementary transistors each having an emitter electrode, a collector electrode and a base electrode, an impedance connected only between said emitter electrode of one of said pair and said emitter electrode of the other of said pair, a source of biasing voltage connected between said collector electrode of one of said pair and said collector electrode of the other of said pair to supply current to said collector electrodes, a source of signal voltage connected between said base electrode of one of said pair and said base electrode of the other of said pair, said signal voltage having signal variations effective to produce variations in said current to said collector electrodes and having a variable average value with respect to said biasing voltage, said variable average value being reflected at said emitter electrodes of said complementary transistors to make said current to said collector electrodes unaffected by said variable average value, and an output circuit connected to at least one of said complementary transistors to respond to variations in said current to said collector electrodes.

References Cited by the Examiner

UNITED STATES PATENTS

| | | | |
|---|---|---|---|
| 2,813,934 | 11/57 | Cibelius et al. | 330—15 |
| 2,818,541 | 12/57 | Weber et al. | 323—75 X |
| 2,847,519 | 9/58 | Aronson | 330—13 |
| 2,924,757 | 2/60 | Schaeve | 317—148.5 |
| 3,032,690 | 5/62 | Elliot | 317—148.5 X |
| 3,096,492 | 7/63 | Vogt. | |
| 3,117,238 | 1/64 | McNair. | |

OTHER REFERENCES

Electronics: "Quasi-Complementary Transistor Amplifier" by Lin; September 1956, pages 173–175.

Radio-Electronics: "Transistorized 6 Watt Hi-Fi"; August 1957, page 108.

SAMUEL BERNSTEIN, *Primary Examiner.*

ROBERT H. ROSE, *Examiner.*